(12) United States Patent
Rowley

(10) Patent No.: US 10,872,640 B2
(45) Date of Patent: Dec. 22, 2020

(54) CAPACITIVE VOLTAGE DIVIDERS COUPLED TO VOLTAGE REGULATORS

(71) Applicant: Micron Technology, Inc., Boise, ID (US)

(72) Inventor: Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 298 days.

(21) Appl. No.: 16/119,564

(22) Filed: Aug. 31, 2018

(65) Prior Publication Data

US 2020/0075061 A1 Mar. 5, 2020

(51) Int. Cl.
*G11C 5/14* (2006.01)
*G06F 1/3296* (2019.01)
(Continued)

(52) U.S. Cl.
CPC ............ *G11C 5/147* (2013.01); *G06F 1/3296* (2013.01); *H02M 1/00* (2013.01); *H02M 2001/0045* (2013.01)

(58) Field of Classification Search
CPC ................. G11C 5/147; G06F 1/3296; H02M 2001/0045
See application file for complete search history.

(56) References Cited

U.S. PATENT DOCUMENTS 6,515,903 B1 * 2/2003 Le ......................... G11C 16/30
327/536
6,965,223 B1 11/2005 Maclean et al.
(Continued)

FOREIGN PATENT DOCUMENTS

JP 2016-184302 A 10/2016
TW M371258 12/2009
(Continued)

OTHER PUBLICATIONS

International Search Report and Written Opinion from related international application No. PCT/2019/048774, dated Dec. 17, 2019, 12 pages.
(Continued)

*Primary Examiner* — Jaweed A Abbaszadeh
*Assistant Examiner* — Gayathri Sampath
(74) *Attorney, Agent, or Firm* — Brooks, Cameron & Huebsch, PLLC

(57) ABSTRACT

A method of operating a memory sub-system includes receiving an input voltage at a power management (PM) component of a memory sub-system, where the PM component includes a capacitive voltage divider (CVD), a linear voltage regulator (LVR), and a switching voltage regulator (SVR). The method includes determining whether the input voltage corresponds to a low power mode of the memory sub-system and that the input voltage is higher than an uppermost supply voltage at which a memory component of the memory sub-system is configured to operate. The method further includes selectably coupling, responsive to a determination of the low power mode, the CVD and the LVR and sequentially reducing the input voltage by the CVD and the LVR to a supply voltage for the memory component, where the supply voltage is not higher than the uppermost supply voltage at which the memory component is configured to operate.

21 Claims, 6 Drawing Sheets

(51) Int. Cl.
  *H02M 1/00* (2006.01)
  *G06F 1/28* (2006.01)
  *G06F 1/30* (2006.01)
  *G06F 1/3234* (2019.01)
  *G06F 1/26* (2006.01)

(56) References Cited

U.S. PATENT DOCUMENTS

| | | |
|---|---|---|
| 8,222,881 B2 | 7/2012 | Ivanov et al. |
| 8,542,059 B2 | 9/2013 | Tejada et al. |
| 9,536,805 B2 | 1/2017 | Fazelpour et al. |
| 9,753,470 B1 | 9/2017 | Hawley et al. |
| 9,785,222 B2 | 10/2017 | Doyle et al. |
| 9,929,130 B2 | 3/2018 | Kent |
| 9,973,431 B2 | 5/2018 | Mishra et al. |
| 2007/0139025 A1 | 6/2007 | Vinn et al. |
| 2008/0089140 A1* | 4/2008 | Passerini ............ G11C 7/02 365/189.09 |
| 2008/0203991 A1 | 8/2008 | Williams |
| 2012/0081086 A1* | 4/2012 | Van Dijk ............ H02M 3/158 323/273 |
| 2012/0313696 A1* | 12/2012 | Tejada ............ G11C 5/147 327/538 |
| 2013/0147446 A1* | 6/2013 | Kris ............ G06F 1/26 323/273 |
| 2014/0082385 A1* | 3/2014 | Reule ............ G06F 1/3275 713/320 |
| 2014/0253072 A1 | 9/2014 | Hussien et al. |
| 2017/0062056 A1 | 3/2017 | Park et al. |
| 2017/0099011 A1 | 4/2017 | Freeman et al. |

FOREIGN PATENT DOCUMENTS

| | | |
|---|---|---|
| TW | 201117544 A | 5/2011 |
| TW | 201125268 A | 7/2011 |
| TW | 201444225 A | 11/2014 |
| TW | 201721328 A | 6/2017 |

OTHER PUBLICATIONS

Office Action and Search Report from related Taiwan patent application No. 108131365, dated Apr. 23, 2020, 19 pages.

* cited by examiner

540 →

```
┌─────────────────────────────────────────────────────────┐
│ RECEIVING AN INPUT VOLTAGE AT A POWER MANAGEMENT (PM)   │
│ COMPONENT OF A MEMORY SUB-SYSTEM, WHERE THE PM COMPONENT│──542
│ INCLUDES A CAPACITIVE VOLTAGE DIVIDER (CVD),            │
│ A LINEAR VOLTAGE REGULATOR (LVR),                       │
│ AND A SWITCHING VOLTAGE REGULATOR (SVR)                 │
└─────────────────────────────────────────────────────────┘
                              │
┌─────────────────────────────────────────────────────────┐
│ DETERMINING, BY A MONITORING UNIT OF THE PM COMPONENT,  │
│ THAT THE INPUT VOLTAGE CORRESPONDS TO A LOW POWER MODE  │
│ OF THE MEMORY SUB-SYSTEM AND THAT THE INPUT VOLTAGE IS  │──544
│ HIGHER THAN AN UPPERMOST SUPPLY VOLTAGE AT WHICH        │
│ A MEMORY COMPONENT OF THE MEMORY SUB-SYSTEM             │
│ IS CONFIGURED TO OPERATE                                │
└─────────────────────────────────────────────────────────┘
                              │
┌─────────────────────────────────────────────────────────┐
│ SELECTABLY COUPLING, RESPONSIVE TO DETERMINATION        │──546
│ OF THE LOW POWER MODE, THE CVD AND THE LVR              │
└─────────────────────────────────────────────────────────┘
                              │
┌─────────────────────────────────────────────────────────┐
│ SEQUENTIALLY REDUCING THE INPUT VOLTAGE BY THE CVD AND  │
│ THE LVR TO A SUPPLY VOLTAGE FOR THE MEMORY COMPONENT,   │
│ WHERE THE SUPPLY VOLTAGE IS NOT HIGHER THAN             │──548
│ THE UPPERMOST SUPPLY VOLTAGE AT WHICH THE               │
│ MEMORY COMPONENT IS CONFIGURED TO OPERATE               │
└─────────────────────────────────────────────────────────┘
```

CAPACITIVE VOLTAGE DIVIDERS COUPLED TO VOLTAGE REGULATORS

TECHNICAL FIELD

The present disclosure relates generally to memory sub-systems, and more particularly, to capacitive voltage dividers coupled to voltage regulators for memory sub-systems.

BACKGROUND

A memory sub-system can be a storage system, such as a solid-state drive (SSD), and can include one or more memory components that store data. The memory components can, for example, include volatile memory components and non-volatile memory components. The memory sub-system can include a controller that can manage the memory components and allocate data to be stored at the memory components. In general, a host system may utilize a memory sub-system to store data at the memory components and to retrieve data from the memory components via the controller. Various memory sub-systems include a power management component to manage power allocation.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a flow diagram of an example method to operate a capacitive voltage divider coupled to a linear voltage regulator in accordance with some embodiments of the present disclosure.

DETAILED DESCRIPTION

Figure 1:
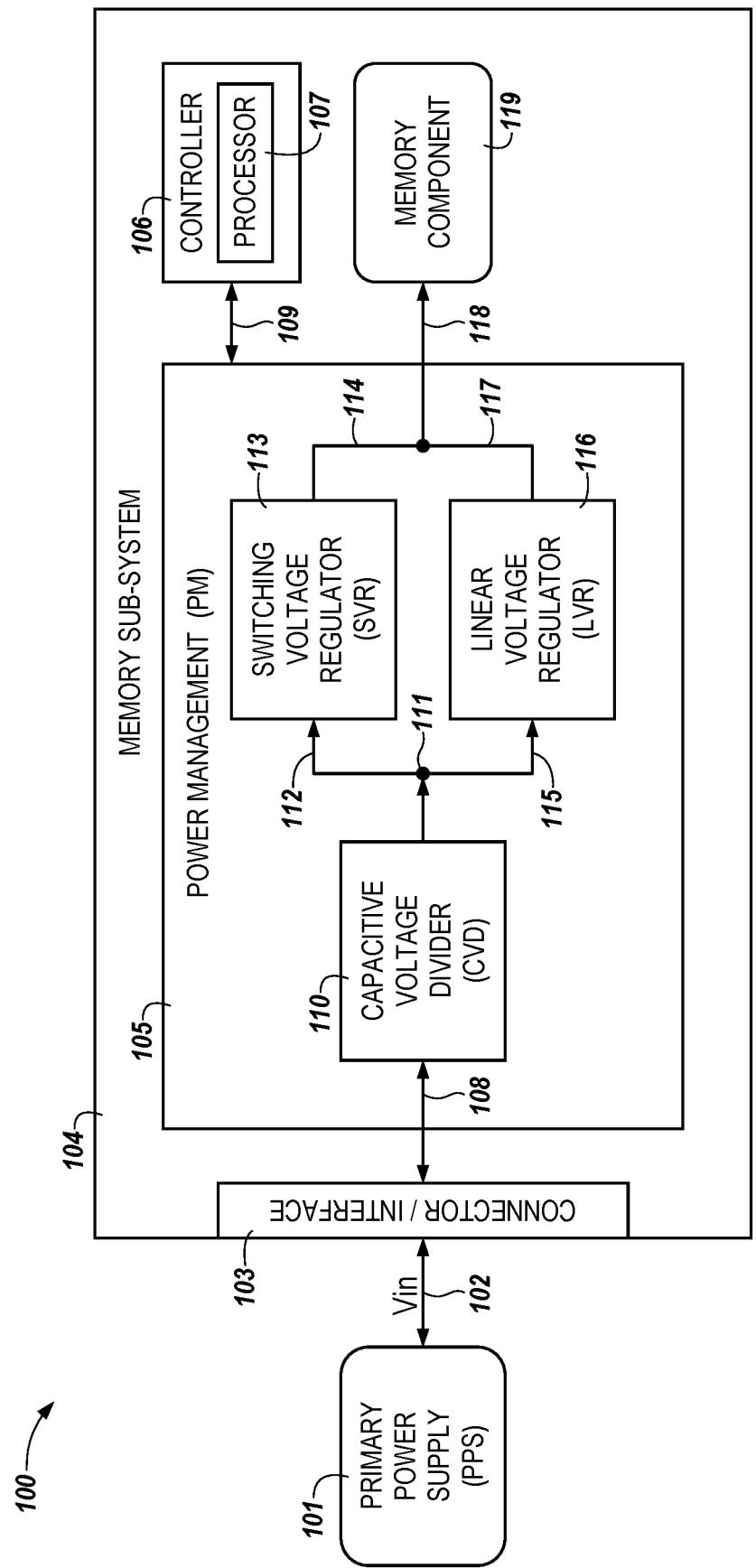
FIG. 1 illustrates an example computing environment that includes a memory sub-system in accordance with some embodiments of the present disclosure.

Aspects of the present disclosure are directed to capacitive voltage dividers (CVD) selectably coupled to voltage regulators in a memory sub-system. A memory sub-system is also hereinafter referred to as a "memory device." An example of a memory sub-system is a storage system, such as a solid-state drive (SSD). Various memory sub-systems can include a power management (PM) component to manage receipt of a primary supply voltage (PSV) from an electrical power source and to appropriately allocate electrical power (e.g., magnitudes of voltages) so as to be compatible with operation of one or more memory components of a particular memory sub-system. As used herein, a "memory component" can refer to a discrete device or physical entity, including an array of memory cells, configured to operate within a memory sub-system. Memory components, as described herein, can include ferroelectric RAM, NOR flash, programmable read-only memory (e.g., FPROM, EEPROM, OTP NVM, etc.) and/or RAM, among other volatile and/or non-volatile memory.

In applications of SSD technology, it is desirable to perform various tasks with a high degree of energy (e.g., electrical power) efficiency. For example, it is desirable to increase energy efficiency, by reduction of electrical power consumption, in a low power mode in which a lower input voltage is supplied relative to a mode that operates at a higher input voltage (e.g., in a "normal" power mode to enable read, write, erase, logic, parallel processing, and/or data transfer operations, among other operations). Examples of such a low power mode include a standby mode, a slumber mode, and/or a sleep mode, among others, in which maintenance of performance of basic operations at a low input voltage is intended (e.g., a lowest possible input voltage). One challenge to this is operating a linear voltage regulator (LVR) or a switching voltage regulator (SVR) at such low input voltages since LVRs and SVRs each require some threshold level of electrical voltage and/or current to keep their circuits operational. Such "quiescent" voltages and/or currents only can be reduced to the threshold level for each type of regulator.

As described further herein, an example of an LVR can be a low dropout (LDO) regulator and an example of an SVR can be a buck regulator, among other types of SVRs and LVRs. An LDO can be configured to operate at low quiescent voltages and/or currents, although at a cost of low energy efficiency when translating a low power mode input voltage to an output voltage with a relatively high input-output voltage differential (e.g., from 3.3 volts (V) to 1.0V relative to 1.2V to 1.0V). A buck regulator can inherently operate at high quiescent voltages and/or currents, at a cost of low energy efficiency, based on being configured as an SVR that operates as a pulse width modulator such that an input voltage is connected to a circuit by a switch being turned on and is not connected to the circuit by the switch being turned off in a particular time period, with the on/off voltages being averaged to provide an output voltage. The energy efficiency can be further reduced by the buck regulator being configured to perform translation of voltages at a higher input voltage (e.g., the input voltage of the normal power mode) to an output voltage having a higher input-output voltage differential relative to the LDO (e.g., from 12.0V to 1.0V for the buck regulator relative to 1.2V to 1.0V for the LDO). Thus, utilizing a low input voltage and/or obtaining a high energy efficiency can be challenges in a low power mode for both an LVR regulator and an SVR regulator.

A CVD circuit can be more energy efficient than an LVR regulator and/or an SVR regulator in translation of an input voltage to an output voltage. A drawback of utilizing a CVD is that the CVD is configured to divide the input voltage at discrete levels (e.g., fractions) based on a number of capacitors being connected for division of the input voltage. As such, obtaining an output voltage from a CVD that is compatible with a supply voltage of a particular memory component from an input voltage being supplied by a primary power supply (PPS) to the CVD can be a challenge without manipulation of a PSV level of the PPS.

Aspects of the present disclosure address the above, and other deficiencies, by selectably coupling the CVD and the LVR regulator (e.g., relative to alternatively coupling to an SVR regulator). In a first configuration (e.g., as illustrated in FIG. 1), a CVD can be configured to accommodate multiple different PSVs by converting multiple different PSVs as first supply voltages into a second supply voltage (e.g., within a limited range of supply voltages) compatible with operation of a particular LVR. For example, the CVD can receive 3.6V as the first supply voltage in the low power mode and can divide the voltage into a ⅓ fraction by connection of three capacitors to yield 1.2V as the second supply voltage for the coupled LVR. The LVR can reduce the 1.2V second supply voltage 0.2V to a 1.0V third supply voltage compatible with operation of the particular memory component. As described further with regard to FIG. 5, the closer the CVD second supply voltage provided as input to the LVR is to the LVR output voltage (third supply voltage), the higher the energy efficiency is of the sequence of voltage reductions utilizing the CVD followed by the LVR due, at least in part, to the small input-output voltage differential across the LVR.

Figure 2:
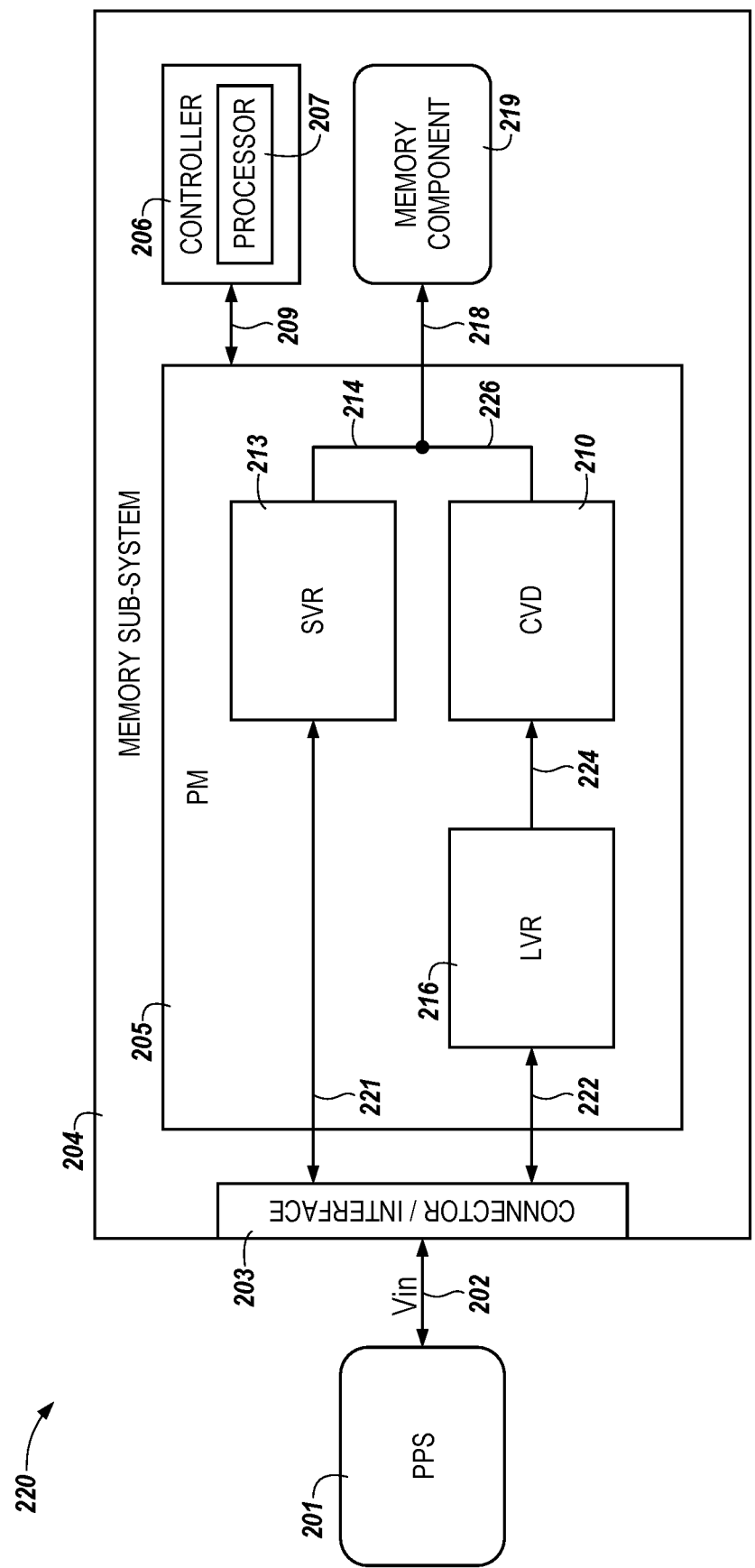
FIG. 2 illustrates another example computing environment that includes a memory sub-system in accordance with some embodiments of the present disclosure.

In a second configuration (e.g., as illustrated in FIG. 2), an LVR can receive the PSV as a first supply voltage and can reduce the first supply voltage to a second supply voltage for a CVD. The first supply voltage can be reduced to a particular second supply voltage that is a multiple of a third supply voltage compatible with operation of the particular memory component. For example, the LVR can convert a first supply voltage of 3.3V in the low power mode to 3.0V as the second supply voltage and the second supply voltage can be provided to a coupled CVD in order to divide, by connection of three capacitors, the 3.0V to 1.0V as the third supply voltage. As described further with regard to FIG. 5, the smaller the input-output voltage differential of the second supply voltage provided from the LVR as an input voltage to the CVD, the higher the energy efficiency is of the sequence of voltage reductions utilizing the LVR followed by the CVD due, at least in part, to the small input-output voltage differential across the LVR.

Hence, implementation of the first configuration and/or the second configuration just described can notably improve utilization of a low input voltage and/or obtaining a high energy efficiency in a low power mode for a PM component of an SSD. Implementation of the first and/or second configurations also can be extended to uses and/or modes other than the low power mode in a power management architecture of an SSD.

FIG. 1 illustrates an example computing environment 100 that includes a memory sub-system 104 (e.g., being an SSD or being part of an SSD) in accordance with some embodiments of the present disclosure. The computing environment 100 illustrated in FIG. 1 corresponds to the just-described first configuration and shows various components that are part of, or that are coupled to, the memory sub-system. For example, a primary power supply (PPS) 101 can be coupled to the memory sub-system 104. As used herein, "coupled to" generally refers to a connection between components, which can be an indirect communicative connection or direct communicative connection (e.g., without intervening components), whether wired or wireless, including connections such as electrical, optical, magnetic, etc.

The memory sub-system 104 can include a PM component 105. The PM component 105 can, in a number of embodiments, include a CVD 110, an SVR 113, and an LVR 116. The memory sub-system 104 can include the PM component 105 being coupled to 109 a memory device controller 106 (hereinafter referred to as "controller").

The PM component 105 on memory sub-system 104 can include multiple components configured to contribute to performance of power management operations, including increasing energy efficiency of an SSD in a low power mode.

For example, the PM component 105 can include the CVD 110 that is selectably coupled in a particular time period to one (e.g., not both) of the SVR 113 and the LVR 116. The controller 106 can, in a number of embodiments, be selectably coupled to the CVD 110, the SVR 113, and/or the LVR 116 of the PM component 105. The controller 106 can be configured, responsive to a determination that the memory sub-system 104 receives an input voltage (PSV 102 as $V_{in}$) in a particular range, to selectably direct that the CVD 110 is coupled to either the SVR 113 or the LVR 116.

For example, a monitoring unit included on the CVD 110 (e.g., as shown at 330 and described in connection with FIG. 3) and/or included on a connector/interface 103 (e.g., as shown at 430 and described in connection with FIG. 4) can be configured to determine, in a number of embodiments, whether the memory sub-system 104 is in a low power mode by, for example, detecting that the PSV 102 is in a range of 2-5V or whether the memory sub-system 104 is in a normal power mode by, for example, detecting that the PSV 102 is in a range of 9V or higher (e.g., 12V). Responsive to determination that PSV 102 corresponds to the low power mode, the controller 106 can direct the CVD to reduce, by connection of multiple capacitors (e.g., as shown at 332 and described in connection with FIG. 3), the PSV 102 to a second supply voltage 115 compatible with operation of the LVR 116. The controller 106 can further direct the CVD 110 to be coupled (e.g., via switch 111) to the LVR 116, instead of the SVR 113, to supply the second supply voltage 115.

In a number of embodiments, the LVR 116 can be selected from a number of series regulators or shunt regulators. For example, the LVR 116 can be an LDO regulator (e.g., as shown at 316 and described in connection with FIG. 3) that is configured to utilize a PSV 102 that is lower than that compatible with operation of conventional LVRs because the LDO regulator can waste less energy than conventional LVRs (or SVRs). In a number of embodiments, the SVR 113 can be selected from a buck/boost regulator and a buck regulator (e.g., as shown, respectively, at 313-1 and 313-2 and described in connection with FIG. 3).

As used herein, stating that a voltage is "compatible with" operation of a particular component is intended to mean that supplying a higher voltage can inactivate (e.g., rupture, burn out, etc.) a fuse, a transistor, a capacitor, etc., of a component configured to operate in a lower voltage range or that supplying a lower voltage can be below a voltage threshold for operation of the component. For example, the PSV 102 can be in a range of from around 5-12V or higher, which can be compatible with operation of the CVD 110 and/or the SVR 113, and a voltage compatible with operation of the LVR 116 can be in a range of from around 2-4V or lower.

The controller 106 can be further configured, responsive to the determination that the memory sub-system 104 is in the low power mode rather than the normal power mode, to decouple (e.g., via switch 111) the CVD 110 from the SVR 113 and couple (e.g., via switch 111) the CVD 110 to the LVR 116 to provide second supply voltage 115 to the LVR 116. For example, when the memory sub-system 104 receives a PSV 102 to enable active processing of various operations in the normal power mode, the CVD 110 can be coupled (e.g., via switch 111) to the SVR 113 to provide second supply voltage 112 to the SVR 113. However, when the memory sub-system 104 receives a PSV 102 consistent with one of the modes within the low power mode (e.g., standby, slumber, and/or sleep modes, among others), the controller 106 can direct that the CVD 110 be decoupled (e.g., via switch 111) from the SVR 113 and coupled to the LVR 116 to provide second supply voltage 115 to the LVR 116. The controller 106 can be further configured, responsive to a determination that the memory sub-system 104 is in the normal power mode (e.g., in the normal power mode rather than in a preceding a low power mode), to decouple the CVD 110 from the LVR 116 and couple the CVD 110 to the SVR 113 to provide second supply voltage 112 to the SVR 113.

In a number of embodiments, the LVR 116 can be configured to reduce a second supply voltage provided by the CVD 110 to a third supply voltage compatible with operation of a number of memory components (e.g., represented as a particular memory component 119) of the memory sub-system 104. For example, when in the low power mode, the CVD 110 can reduce (e.g., by connecting three capacitors) a PSV 102 of 3.6V to a second supply voltage 115 of 1.2V to be provided to the LVR 116 and the LVR 116 can reduce the received second supply voltage of 1.2V to a third supply voltage 117 of 1.0V that is compatible with operation of the particular memory component 119. The third supply voltage 117 can be output via a rail 118 from the LVR 116 to the particular memory component 119 using circuitry coupled to the LVR 116 and the rail 118.

In a number of embodiments, the SVR 113 also can be configured to reduce a second supply voltage 112 provided by the CVD 110 to a third supply voltage 114 compatible with operation of a particular memory component 119. For example, when in the normal power mode, the CVD 110 can reduce (e.g., by connecting three capacitors) a PSV 102 of 12.0V to a second supply voltage 112 of 4.0V to be provided to the SVR 113 and the SVR 113 can reduce the received second supply voltage 112 of 4.0V to the third supply voltage 114 of 1.0V that is compatible with operation of the particular memory component 119. The third supply voltage 114 can be output from the SVR 113 via the rail 118 to the particular memory component 119 using circuitry coupled to the SVR 113 and the rail 118. Because the third supply voltages 114, 117 can be output from only one of the SVR 113 and the LVR 116 in a particular time period, a number of embodiments may not have a switch to enable alternative connections of the second supply voltages 114, 117 to the rail 118.

The CVD 114 can be configured to receive the PSV 102 as the first supply voltage 108 and to provide the second supply voltage 115 to the LVR 116 in the low power mode and to alternatively provide the second supply voltage 112 to the SVR 113 in the normal power mode. The second supply voltage 115 provided to the LVR 116 can, in a number of embodiments, be less than the second supply voltage 112 provided to the SVR 113 (e.g., 1.2V versus 4.0V). The first supply voltage 108 can, in a number of embodiments, be received via the connector/interface 103 from PPS 101. The connector/interface 103 can provide PSV 102 as the first supply voltage 108 to the CVD 110. The second supply voltage 112 provided to the SVR 113 and/or the second supply voltage 115 provided to the LVR 116 can be voltages that have been converted by the CVD 110 from the PSV 102 to a voltage that, in a number of embodiments, is not higher than an uppermost supply voltage at which either the SVR 113 or the LVR 116 is configured to operate, responsive to whether the memory sub-system 104 is in the normal power mode or the low power mode.

The CVD 110 can be configured to receive multiple different PSVs that are higher than, for example, the uppermost supply voltage for the LVR 116. For example, in the low power mode, the PSVs can range from being notably greater than (e.g., 5.0V) an uppermost LVR 116 supply voltage (e.g., 2.3V) to only being slightly greater than (e.g., 2.4V) the uppermost LVR 116 supply voltage. The CVD 110 can be configured to reduce each of the different PSVs to provide the second supply voltage 115 to the LVR 116 as a supply voltage that is compatible with operation of the LVR 116. The CVD 110 can be configured to divide the different PSVs to produce the second supply voltage 115 such that the second supply voltage 115 can be selectably determined to provide the supply voltage compatible with operation of the LVR 116. Producing the second supply voltage 115 can be performed by selectably connecting multiple capacitors of the CVD 110 in multiple configurations. For example, the CVD 110 can be configured to selectably adjust (e.g., reduce) the PSV 102 first supply voltage 108 to the second supply voltage 115 for the LVR 116 and/or the second supply voltage 112 for the SVR 113 via multiple series-coupled capacitors being selectably connected. The configuration of the connections and/or how many of the multiple capacitors are selectably connected can depend on how high the PSV 102 is and/or an amount that the PSV 102 is to be reduced to be compatible with operation of the LVR 116 and/or the SVR 113.

FIG. 2 illustrates another example computing environment 220 that includes a memory sub-system 204 (e.g., being an SSD or being part of an SSD) in accordance with some embodiments of the present disclosure. The computing environment 220 illustrated in FIG. 1 corresponds to the previously described second configuration and shows various components that are part of, or that are coupled to, the memory sub-system. For example, computing environment 220 can include various components that correspond to components shown and described in connection with FIG. 1. Such components can, for example, include PPS 201, PSV 202, connector/interface 203, memory sub-system 204, controller 206, processor 207, and/or a number of memory components (e.g., memory component 219) that can be part of, or coupled to, the memory sub-system 204.

The memory sub-system 204 can include a PM component 205. The PM component 205 can, in various embodiments, include a CVD 210, an SVR 213, and an LVR 216. The memory sub-system 204 can include the PM component 205 being coupled to 209 a controller 106 that can include a processor 107, as described further herein.

The PM component 205 on memory sub-system 204 can include multiple components configured to contribute to performance of power management operations, including increasing energy efficiency of an SSD in a low power mode. For example, the computing environment 220 can include a PPS 201 that is selectably coupled in a particular time period to one (e.g., not both) of the SVR 213 and the LVR 216. The controller 206 can, in a number of embodiments, be selectably coupled to the LVR 216 and/or the SVR 213 of the PM component 205. The controller 206 can be configured, responsive to a determination that the memory sub-system 204 receives an input voltage (PSV 202 as $V_{in}$) in a particular range from the PPS 201, to selectably direct that the PPS 201 is coupled to either the SVR 113 or the LVR 116 as a first supply voltage 221, 222.

For example, a monitoring unit (e.g., as shown at 430 in FIG. 4) included on, or associated with, the connector/interface 203 can be configured to determine, in a number of embodiments, whether the memory sub-system 204 is in a low power mode by, for example, detecting that the PSV 202 is in a range of 2-5V or whether the memory sub-system 204 is in a normal power mode by, for example, detecting that the PSV 202 is in a range of 9V or higher (e.g., 12V). Responsive to determination that PSV 202 corresponds to the low power mode, the controller 206 can direct that the connector/interface 203 be coupled to and that PSV 202 be received by the LVR 216 as a first supply voltage 222. The controller 206 can further direct the LVR 216 to reduce first supply voltage 222 to a second supply voltage 224 compatible with operation of the CVD 210. The LVR 216 can be coupled to the CVD 210 (e.g., instead of the SVR) to supply the second supply voltage 224 to the CVD 210. The CVD 210 can reduce, by connection of multiple capacitors (e.g., as shown at 332 and described in connection with FIG. 3), a received second supply voltage 224 to a third supply voltage 226 compatible with operation of the particular memory component 219.

The second supply voltage 224 compatible with operation of the CVD 210 can in a number of embodiments, be a particular voltage that is divisible by the CVD 210 to produce a third supply voltage 226 that is compatible with operation of a particular memory component 219. For example, the second supply voltage 224 can be reduced from a first supply voltage 222 (e.g., PSV 202) of 3.3V in the low power mode to 3.0V, which is divisible (e.g., by connection of three capacitors) to the third supply voltage 226 of 1.0V that is compatible with operation of the particular memory component 219.

As described in connection with FIG. 1, in a number of embodiments, the LVR 216 shown in FIG. 2 can be selected from a number of series regulators or shunt regulators. For example, the LVR 216 can be an LDO regulator (e.g., as shown at 316 and described in connection with FIG. 3) that is configured to utilize a PSV 202 that is lower than that compatible with operation of conventional LVRs (or SVRs). In a number of embodiments, the SVR 213 can be selected from a buck/boost regulator and a buck regulator (e.g., as shown, respectively, at 313-1 and 313-2 and described in connection with FIG. 3). For example, the PSV 202 can be in a range of from around 5-12V or higher, which can be compatible with operation of the SVR 213, and a voltage compatible with operation of the LVR 216 can be in a range of from around 4V or lower.

The controller 206 can be further configured, responsive to a determination that the memory sub-system 204 is in a low power mode rather than a normal power mode, to decouple the SVR 213 from the PPS 201 and couple the LVR 216 to the PPS 201 to receive the PSV 202 as first supply voltage 222. The controller 206 can be further configured, responsive to a determination that the memory sub-system is in a normal power mode rather than the low power mode, to decouple the LVR 216 from the PPS 201 and couple the SVR 213 to the PPS 201 to provide the PSV 202 as first supply voltage 221 for receipt of the first supply voltage 221 by SVR 213.

Coupling and decoupling of the SVR 213 and the LVR 216 can, in a number of embodiments, be performed by activation and/or inactivation of a number of switches (not shown) in, or associated with, the connector/interface 203, in response to particular signals from the controller 206. For example, when the memory sub-system 204 receives a PSV 202 to enable active processing of various operations in the normal power mode, the SVR 213 can be coupled to the PPS 201 to provide first supply voltage 221 to the SVR 213. However, when the memory sub-system 204 receives a PSV 202 consistent with one of the modes within the low power mode (e.g., in either the standby, slumber, and/or sleep modes, among others), the controller 206 can direct that the SVR 213 be decoupled from the PPS 201 and that the PPS 201 be coupled to the LVR 216 to provide first supply voltage 222 to the LVR 216.

The LVR 216 can be configured (e.g., as an LDO regulator) to reduce the first supply voltage 222 to second supply voltage 224 compatible with operation of the CVD 210. The CVD 210 can be configured to reduce the second supply voltage 224 to a third supply voltage 226 compatible with operation of the memory component 219.

The PSV 202 from the PPS 201 being in the particular range can correspond to the memory sub-system 204 being in the low power mode, in which a lower input voltage is supplied relative to a mode that operates at a higher input voltage (e.g., the normal mode). The higher input voltage can, in a number of embodiments, be a PSV 202 of 12V or higher and the lower input voltage can be a PSV 202 in a range of from 2V-5V.

In a number of embodiments, the CVD 210 can be configured to reduce a second supply voltage 224 provided by the LVR 216 to a third supply voltage 226 compatible with operation of a number of memory components (e.g., represented as a particular memory component 119) of the memory sub-system 204. For example, when in the low power mode, the CVD 210 can reduce (e.g., by connecting three capacitors) a second supply voltage 224 of 3.0V to a third supply voltage 226 of 1.0V to be provided to and compatible with operation of the particular memory component 219. The third supply voltage 226 can be output via a rail 218 from the CVD 210 to the particular memory component 219 using circuitry coupled to the CVD 210 and the rail 118.

In a number of embodiments, the SVR 213 also can be configured to reduce a first supply voltage 221 provided by the PPS 201 to a second supply voltage 214 compatible with operation of a particular memory component 219. For example, when in the normal power mode, the SVR 213 can, in a number of embodiments, reduce a first supply voltage 221 of 12.0V to a second supply voltage 214 of 1.0V. The second supply voltage 214 can be output via the rail 218 from the SVR 213 to the particular memory component 219 using circuitry coupled to the SVR 213 and the rail 218. In a number of embodiments, the SVR 213 can be coupled to (not shown) the CVD 210 to further reduce (e.g., by connecting three capacitors) a third supply voltage (not shown) of 3.0, reduced by SVR 213 from the first supply voltage of 12.0V and provided to the CVD 210, to the second supply voltage 214 of 1.0V to be provided to the particular memory component 219. As such, the second supply voltage 214 can be output via the rail 218 from the CVD 210 to the particular memory component 219 using circuitry coupled to the CVD 210 and the rail 218. Because the second supply voltages 214, 226 can be output from only one of the SVR 213 and the CVD 210 in a particular time period, a number of embodiments may not have a switch to enable alternative connections of the second supply voltages 214, 226 to the rail 118.

In a number of embodiments, memory sub-systems 104 and 204 can include one or more memory components (e.g., as represented by memory components 119 and 219). The memory components can, in various embodiments, include any combination of different types of non-volatile memory (NVM) components and/or volatile memory (VM) components. For example, the memory components can include at least one array of VM cells, at least one array of NVM cells, or at least one array of the VM cells in combination with at least one array of the NVM cells. In some embodiments, the memory sub-systems 104 and 204 are a storage system. An example of a storage system is an SSD. The sub-systems 104 and 204 can, in a number of embodiments, be an SSD or the sub-systems 104 and 204 can be formed as part of an SSD.

In some embodiments, the sub-systems 104 and 204 are hybrid memory/storage sub-systems.

Each of the memory components can include one or more arrays of memory cells, such as single level cells (SLCs) or multi-level cells (MLCs). The MLCs can, in a number of embodiments, include triple level cells (TLCs) and/or quad-level cells (QLCs). In some embodiments, a particular memory component can include both an SLC portion and an MLC portion of memory cells. Each of the memory cells can store one or more bits of data (e.g., data blocks).

An example of NVM components includes a negative-and (NAND) type flash memory. Although NVM components such as NAND type flash memory are described, the memory components can be based on various other types of memory, such as VM. In a number of embodiments, the memory components can be, but are not limited to, random access memory (RAM), read-only memory (ROM), dynamic random access memory (DRAM), synchronous dynamic random access memory (SDRAM), phase change memory (PCM), magneto random access memory (MRAM), NAND flash memory, negative- or (NOR) flash memory, electrically erasable programmable read-only memory (EEPROM), and a cross-point array of NVM cells. A cross-point array of NVM can perform bit storage based on a change of bulk resistance, in conjunction with a stackable cross-gridded data access array. Additionally, in contrast to many flash-based memories, cross-point NVM can perform a write in-place operation, where an NVM cell can be programmed without the NVM cell being previously erased. Furthermore, the memory cells of the memory components can be grouped as memory pages or data blocks that can refer to a unit of the memory component used to store data.

The PPS 101, 201 can be an electrical power source that can supply the PSV 102, 202 as $V_{in}$ to the memory sub-systems 104 and 204 for operation of the memory components CVD 110, 210, LVR 116, 216, SVR 113, 213, and/or memory components 119, 219, among other components of the memory sub-systems 104 and 204. The PPS 101, 201 can, for example, be an electrical outlet, a battery, and/or an AC/DC convertor, among other possible power sources. In a number of implementations, the PSV 102, 202 can be higher than a voltage compatible with operation of one or more of the CVD 110, 210, the LVR 116, 216, the SVR 113, 213, and/or the memory components 119, 219.

The controller 106, 206 can communicate with the CVD 110, 210, the LVR 116, 216, the SVR 113, 213, and/or the memory components 119, 219 to control and/or direct performance of operations in the normal power mode, such as reading, writing, and/or erasing data at the memory components 119, 219 and other such operations and/or performance of operations in the low power mode (e.g., standby, slumber, and/or sleep modes, among others). The controller 106, 206 can include hardware, such as one or more integrated circuits and/or discrete components, a buffer memory, or a combination thereof. The controller 106, 206 can be a microcontroller, special purpose logic circuitry (e.g., a field programmable gate array (FPGA), an application specific integrated circuit (ASIC), etc.), or any other suitable processor. The controller 106 can include a processing device (e.g., processor 107, 207) configured to execute instructions stored in local memory (not shown). The local memory of the controller 106, 206 can include an embedded memory configured to store instructions for performing various processes, operations, logic flows, and/or routines that control operation of the memory sub-systems 104, 204, including handling communications between the memory sub-systems 104, 204 and a host system (not shown and hereinafter referred to as a "host"). In some embodiments, the local memory can include memory registers storing memory pointers, fetched data, etc. The local memory also can include read-only memory (ROM) for storing micro-code.

While the example memory sub-systems 104, 204 shown in FIG. 1 and FIG. 2 have been illustrated as including the controller 106, 206 in other embodiments of the present disclosure a memory sub-system may not include a controller and may instead rely upon external control. Such external control can, in a number of embodiments, be provided by an external host and/or by a processor or controller separate from the memory sub-system.

In general, the controller 106, 206 can receive commands for operations from a host and can convert the commands for operations into instructions or appropriate commands to achieve access to the memory components CVD 110, 210, LVR 116, 216, SVR 113, 213, and/or memory components 119, 219 for performance of such operations. The controller 106, 206 can be responsible for other operations such as wear leveling operations, garbage collection operations, error detection and error-correcting code (ECC) operations, encryption operations, caching operations, and/or address translations between a logical block address and a physical block address that are associated with the memory components. The controller 106, 206 can communicate with the host via a physical host interface (e.g., connector/interface 103).

The memory sub-systems 104, 204 also can include additional circuitry or components that are not illustrated. The memory components can, in a number of embodiments, include control circuitry, address circuitry, sensing circuitry, and/or input/output (I/O) circuitry by which the memory components can communicate with controller 106, 206 and/or host. The control circuitry can, for example, include a power control component (PPC) shown at 331 in FIG. 3 and at 431 in FIG. 4, among other control circuitry. The address circuitry can, for example, include row and column decode circuitry. As an example, in some embodiments, the address circuitry can receive an address from the controller 106, 206 and decode the address to access the memory components. Sensing circuitry can include, for example, circuitry by which data values can be written at and/or read from a particular memory cell corresponding to an address in a row and/or column of an array.

In general, the computing environments 100, 220 can include a host that can utilize the memory sub-systems 104, 204 that include the one or more memory components. In a number of embodiments, the PPS 101, 201 can be on and/or can be coupled to the host and/or the PSV 102, 202 can come from the host. The host can provide data to be stored (written) at the memory sub-systems 104, 204 and/or can request data to be retrieved (read) from the memory sub-systems 104, 204, along with providing a PSV 102, 202 appropriate for performance of the operations in the normal power mode, as directed by the controller 106, 206. The host also can provide commands to the controller 106, 206 to place the memory sub-systems 104, 204 in at least one of the modes associated with the low power mode, along with providing a PSV 102, 202 appropriate for placing the memory sub-systems 104, 204 in the low power mode and/or for performance of appropriate operations in the low power mode. The memory sub-systems 104, 204 can include multiple interface connections (e.g., ports) to one or more hosts. A host can send commands to the memory sub-systems 104, 204 via a port.

The host can be a computing device such as a desktop computer, laptop computer, network server, mobile device, or such computing device that includes a memory and a processing device. The host can include, or be coupled to, the memory sub-systems 104, 204 so that the host can read data from or write data to the memory sub-system 104, 204, and/or provide commands for being in the normal power mode versus the low power mode, among other operations. The host can be coupled to the memory sub-systems 104, 204 via a physical host interface (e.g., connector/interface 103). The physical host interface can include control, address, data bus components, etc., to provide an interface for passing control, address, data, and other signals between the memory sub-systems 104, 204 and the host. Examples of a physical host interface can include, but are not limited to, a serial advanced technology attachment (SATA) interface, a peripheral component interconnect express (PCIe) interface, universal serial bus (USB) interface, Fibre Channel, Serial Attached SCSI (SAS), etc. The host can further utilize an NVM Express (NVMe) interface to access the memory components when the memory sub-systems 104, 204 are coupled with the host by the PCIe interface.

Figure 3:
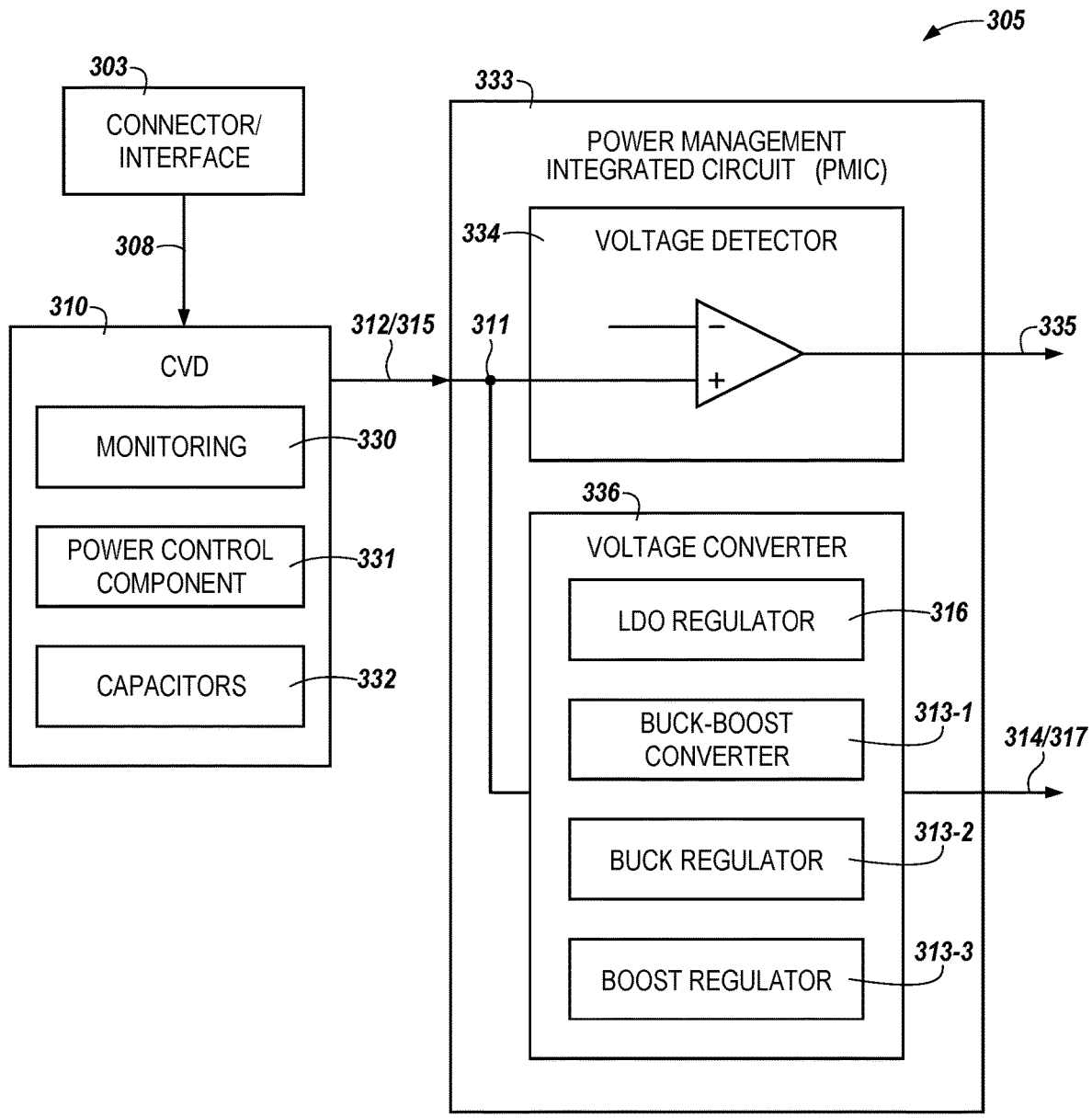
FIG. 3 illustrates an example of a power management component in accordance with some embodiments of the present disclosure.

FIG. 3 illustrates an example of a PM component 305 in accordance with some embodiments of the present disclosure. The PM component 305 illustrated in FIG. 3 can be an embodiment of the PM component 105 shown in the first configuration illustrated in FIG. 1. In the example shown in FIG. 3, the PM component 305 can include a CVD 310, an LVR 316 (e.g., an LDO regulator), and an SVR 313 (e.g., as selected from a buck-boost regulator 313-1, a buck regulator 313-2, and a boost regulator 313-3), as shown at corresponding indicator numbers in FIG. 1. For example, indicator number 110 in FIG. 1 corresponds to indicator number 310 in FIG. 3 in that they both represent embodiments of a CVD, although details of the embodiments of the CVD may differ dependent on descriptions of such provided in connection with different figures. In this example, the LDO regulator 316 and the buck-boost regulator 313-1, buck regulator 313-2, and boost regulator 313-3 can be included in a power management integrated circuit (PMIC) 333, which can be used to manage various power requirements of the memory sub-system 104, memory components, and/or other electronic devices coupled thereto.

The embodiment of the PMIC 333 illustrated in FIG. 3 is shown by way of example and embodiments are not limited as such. Hence, a PMIC consistent with this disclosure can include more or less components than are shown in FIG. 3. The PMIC 333 can be compatible with operation at an uppermost PMIC supply voltage (e.g., second supply voltage 112 for SVR 113 or second supply voltage 115 for LVR 116 shown in FIG. 1) that is lower than a PSV 102 of the memory sub-system 104 received from the PPS 101. The PMIC 333 can be configured to output one or more voltages for operation of the memory sub-system 104 based on a PMIC supply voltage. The voltages to be output can, in a number of embodiments, be determined based on conversion of the PMIC supply voltage to one or more reduced voltages corresponding to voltages compatible with operation of one or more components of system 104, which can include controller 106, memory components (e.g., particular memory component 119), and/or circuitry associated therewith, such as control circuitry, input/output (I/O) circuitry, address circuitry, etc.

The PM component 305 can include a CVD 310 coupled to the PMIC 333. The CVD 310 can be configured to receive the PSV 102 as a first supply voltage 308 by being coupled to a connector/interface 303 and to provide a second supply voltage 312, 315 to the PMIC 333 as the PMIC supply voltage. The magnitude of second supply voltage 312 for the SVR 313 and second supply voltage 115 for the LVR 316 can be dependent upon whether the memory sub-system 104 is in a normal power mode or a low power mode. For example, the magnitude of second supply voltage 312 can correspond to an input voltage compatible with operation of the buck-boost regulator 313-1, buck regulator 313-2, and/or boost regulator 313-3 in the normal power mode and the magnitude of second supply voltage 315 can correspond to an input voltage compatible with operation of the LDO regulator 316 in the low power mode.

The CVD 310 can be configured to receive, as input, multiple different PSVs that are higher than the uppermost PMIC supply voltage. For example, the PSVs can range from being greater than the uppermost PMIC supply voltage (e.g., 5V) to being 240V or more. The CVD 310 can be configured to reduce each of the different PSVs to provide the second supply voltages 312, 315 to the PMIC 333 as the PMIC supply voltage compatible with operation of the SVR 313 or the LVR 316. The CVD 310 can be configured to divide the different PSVs to produce any of the second supply voltages 312, 315 such that the second supply voltages 312, 315 can be selectably determined to provide the PMIC supply voltage compatible with operation of any of the SVRs 313-1, 313-2, 313-3 or the LVR 316. Producing the second supply voltages 312, 315 can be performed by selectably connecting multiple capacitors of the CVD 310 in multiple configurations. For example, the CVD 310 can be configured to selectably adjust (e.g., reduce) the PSV 102 to the second supply voltages 312, 315 via multiple series-coupled capacitors being selectably connected. The configuration of the connections and/or how many of the multiple capacitors are selectably connected can depend on how high the PSV 102 is and/or an amount that the PSV 102 is to be reduced to be compatible with operation of the PMIC 333.

The CVD 310 can be configured to, based on a status of the PSV 102 being monitored by a monitoring unit 330 that is part of the CVD 310, provide signals to select between multiple different connections of the multiple capacitors 332 of the CVD 310. Responsive to a determination by the monitoring unit 330 that the PSV 102 is either within a range of voltages compatible with performance of normal power mode operations or a range of voltages compatible with performance of low power mode operations, the monitoring unit 330 can send differential signals to a power control component (PCC) 331 that is part of the CVD 310. The PCC 331 can, in a number of embodiments, be configured to determine a particular number of (e.g., which of) the multiple capacitors 332 of the CVD 310 to connect to reduce a particular voltage magnitude of the PSV 102 to the second supply voltages 312, 315 compatible with operation of the multiple regulators of the PMIC 333 in the normal power mode and the low power mode, direct the CVD 310 to connect the particular number of the multiple capacitors 332, and direct the CVD 310 to output the second supply voltages 312, 315 to the PMIC 333.

The PMIC 333 can include multiple regulators operable as a voltage converter component 336. The PMIC 333 can be configured to convert the second supply voltages 312, 315 received from the CVD 310 to multiple voltages, for operation of various components of the memory sub-system 104, to be output from the PMIC 333. The multiple regulators of the PMIC 333 can, in a number of embodiments, include a first regulator (e.g., a buck-boost converter 313-1 and/or a buck regulator 313-2) configured to reduce the second supply voltage 312 received from the CVD 310 to one or more third supply voltages 314 compatible with operation of a number of memory components 119 in the normal power mode. For example, the PMIC 333 can be configured to reduce the second supply voltage 312 to a reduced third supply voltage 314 compatible with operation of an array of memory cells of the memory sub-system 104 and the reduced voltage can be selectably output from the PMIC 333 for operation of the array. The voltage converter component 336 of the PMIC 333 can, in a number of embodiments, include a second regulator (e.g., the buck-boost converter 313-1 and/or a boost regulator 313-3) configured to increase either of the second supply voltages 312, 315 received from the CVM 310 for operation of one or more components of the memory sub-system 104.

The voltage converter component 336 of the PMIC 333 can include a buck regulator 313-2, among other types of SVRs, configured to operate on a second supply voltage 312 in the normal power mode. The buck regulator 313-2 can be configured to provide the third supply voltage 314 compatible with operation of the number of memory components 119 in the normal power mode. For example, the PSV 102 can be 12V and the second supply voltage 312 output from the CVD 310 for operation of the buck regulator 313-2 of the PMIC 333 can be 4V, and the voltage output from the PMIC 333 as the further reduced third supply voltage 314 for operation of an array of memory cells can be around 1V. The CVD 310 can perform the first reduction in order to achieve the second supply voltage 312 for output to the PMIC 333 by using the CVD's 310 multiple (e.g., two or more) capacitors 332 configured to, in a number of embodiments, be connected in a configuration to produce the second supply voltage 312. For example, the second supply voltage 312 can be produced by selectably connecting the capacitors 332 serially to output one third (12÷3=4) of the PSV 102.

The voltage converter component 336 of the PMIC 333 can include an LDO regulator 316. The LDO regulator 316 can be an LVR that operates with a very small input-output differential voltage. Multiple LDO regulators 316 can, in a number of embodiments, be provided based on the number of further reduced third supply voltages 314, 317 that are used in the memory sub-system 104. For example, one LDO regulator 316 can be configured to regulate an output voltage of the buck-boost converter 313-1 or the buck regulator 313-2 to output the third supply voltage 314 in the normal power mode. For example, another LDO regulator 316 can be configured to operate on a second supply voltage 315 in the low power mode. The other LDO regulator 316 can be configured to provide the third supply voltage 317 compatible with operation of a number of memory components 119 in the low power mode. For example, the PSV 102 can be 3.6V in the low power mode and the second supply voltage 315 output from the CVD 310 for operation of the other LDO regulator 316 of the PMIC 333 can be 1.2V, and the voltage output from the PMIC 333 as the further reduced third supply voltage 317 for operation of the number of memory components 119 (e.g., an array of memory cells, among other memory components) can be around 1V. The CVD 310 can perform the first reduction of 3.6V to achieve the second supply voltage 315 of 1.2V for output to the LDO regulator 316 by using the CVD's 310 multiple capacitors 332. For example, the second supply voltage 315 can be produced by selectably connecting the capacitors 332 serially to output one third (3.6÷3=1.2) of the PSV 102.

The PMIC 333 can, in a number of embodiments, include a voltage detector 334. The voltage detector 334 can detect whether the second supply voltage 312 exceeds a range of voltages compatible with operation of the PMIC 333 (e.g., in the normal power mode). The voltage detector 334 can generate a power-off signal 335 based on a result of detection of such a second supply voltage 312. The power-off signal 335 can, in a number of embodiments, be sent to enable a disconnect of the PPS 101, the connector/interface 303, and/or the CVD 310 from supplying such a second supply voltage 312. The voltage detector 334 can include a comparator that compares the second supply voltage 312 to a reference voltage and outputs the power-off signal 335 as a result of the comparison. For example, when an uppermost voltage (e.g., second supply voltage 312) compatible with operation of the PMIC 333 is 5V, the reference voltage can be set to 5V. A range of second supply voltages 312 for the normal power mode and second supply voltages 315 for the low power mode and corresponding reference voltages can, in a number of embodiments, be set to various voltage magnitudes. For example, the comparator can, in some embodiments, generate the power-off signal 335 at a logic high level when the second supply voltage 312 is higher than a first reference voltage and can generate the power-off signal 335 at a logic low level when the second supply voltage 312 is lower than a second reference voltage. The second reference voltage can, for example, be higher than the second reference voltage. The PMIC 333 can, in a number of embodiments, include a switch 311 to determine whether the second supply voltages 312, 315 are sent to the voltage detector 334 or the voltage converter 336.

The PMIC 333 can be configured to operate according to one or more configuration profiles, which can control altering a voltage received from the CVD 310 to provide one or more voltages to various memory components of the memory sub-system 104. In a number of embodiments, a particular configuration profile of the PMIC 333 can be selected based on information about system power requirements. Such information can be received, for example, from a host coupled to the memory sub-system 104 and/or the controller 106 of the memory sub-system 104. Non-limiting examples of system power requirements can include operating voltages for the controller 106/processor 107, memory components of the PM component 305, and/or the memory components, including particular memory components 119 such as arrays of memory cells, sensing circuitry, ASICs, state machines, etc., control signals such as voltage signals, control logic, timing signals, and/or other control signals that correspond to particular configuration profiles, power modes (e.g., normal and low power modes) sequencing, master/slave configurations, serial ATA (SATA) input voltages, peripheral component interconnect express (PCIe) input voltages, power backup operations, timing characteristics, operational characteristics, etc. Some system power requirements can be controlled by the controller 106, the processing device 107 thereof, the CVD 310, and/or the PMIC 333 of the PM component 305 based on configuration profiles that are provided by (e.g., stored on) the CVD 310 and/or the PMIC 333.

For example, the CVD 310 of the PM component 305 can be configured to store multiple configuration profiles that can be dynamically selected based on various requirements resulting from changes to a magnitude of the PSV 102 input from the PPS 101 to the memory sub-system 104 via the CVD 310. As used herein, a "configuration profile" generally refers to a protocol, a set of operating voltages (e.g., in the normal and low power modes), master/salve configuration, power backup state, specification, or other information corresponding to operation of a host or another component, such as a memory sub-system 104 (e.g., an SSD), a video card, an audio card, or other computer component 107, such as one or more arrays of memory cells, sensing circuitry for the arrays, etc. For example, aspects of the present disclosure can include the PM component 305 (e.g., the CVM 310 and/or the PMIC 333 of the PM component 305) having memory, such as NVM, disposed thereon. Such memory for the CVD 310 is shown in FIG. 3, for example, at PPC 331. In a number of embodiments, the PM component 305 can include multiple power management configuration pins (not shown) that can receive selection signals (e.g., from a host, the controller 106, and/or the processor 107) to selectively enable particular power configuration profiles stored in the memory of the PM component 305.

For example, the memory of the CVD 310 can be configured to store multiple selectable configuration profiles that can correspond to multiple different profiles for connection of the multiple capacitors 332 of the CVD 310. A particular profile of the multiple different profiles to implement for connection of the multiple capacitors 332 can be selected dependent upon the magnitude of the PSV 102 input (e.g., via the connector/interface 303) from the PPS 101 to the CVD 310.

For example, input of a PSV 102 in a range of voltages compatible with operation of the regulators of the PMIC 333 in the normal power mode can result in selection of a particular profile stored on the PCC 331 of the CVD 310 that includes instructions to enable connection of a certain number of the multiple capacitors 332 so as to provide a second supply voltage 312 compatible with operation of the SVRs (e.g., the buck-boost regulator 313-1, the buck regulator 313-2, and/or the boost regulator 313-3, among other possible SVRs) of the PMIC 333. Alternatively, input of a PSV 102 in a range of voltages compatible with operation of the regulators of the PMIC 333 in the low power mode can result in selection of a particular profile stored on the PCC 331 that includes instructions to enable connection of a certain number of the multiple capacitors 332 so as to provide a second supply voltage 315 compatible with operation of the LVRs (e.g., LDO regulator 316, among other possible LVRs) of the PMIC 333. Any number of the multiple capacitors 332 can have the same capacitance and/or different capacitances.

Figure 4:
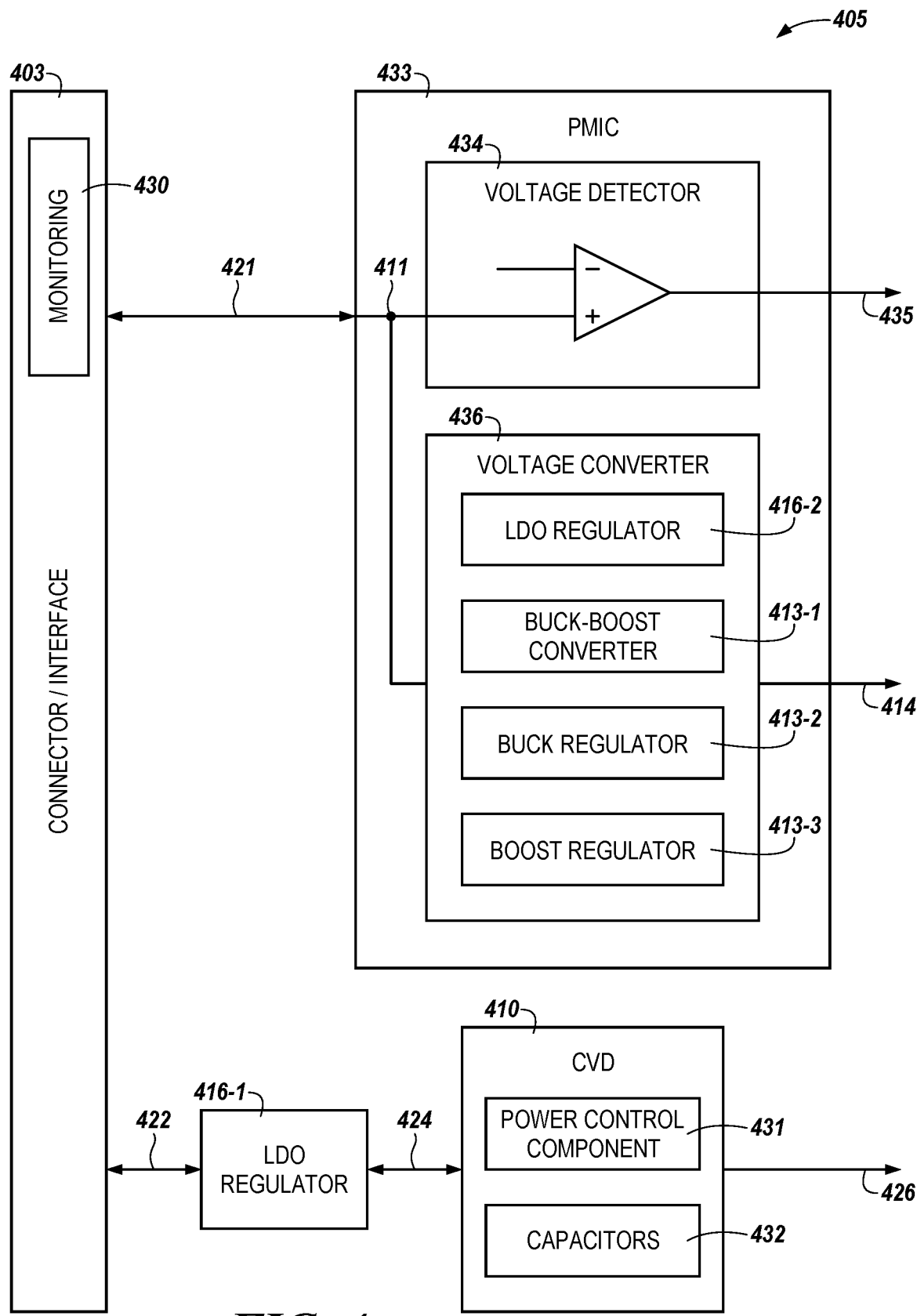
FIG. 4 illustrates another example of a power management component in accordance with some embodiments of the present disclosure.

FIG. 4 illustrates an example of a PM component 405 in accordance with some embodiments of the present disclosure. The PM component 405 illustrated in FIG. 4 can be an embodiment of the PM component 205 shown in the second configuration illustrated in FIG. 2. In the example shown in FIG. 4, the PM component 405 can include an LVR 416-1 (e.g., an LDO regulator), a CVD 410 coupled downstream to the LDO regulator 416-1, and a PMIC 433 that can include an SVR 413 (e.g., as selected from a buck-boost regulator 413-1, a buck regulator 413-2, and a boost regulator 413-3) and an LVR 416-2, among other components. The embodiment of the PMIC 433 illustrated in FIG. 4 is shown by way of example and embodiments are not limited as such. Hence, a PMIC consistent with this disclosure can include more or less components than are shown in FIG. 4. The components of, and associated with, the PM component 405 shown in FIG. 4 are intended to include the structures and/or functions shown and described in connection with components having corresponding indicator numbers in FIG. 2 and FIG. 3 unless explicitly described otherwise in connection with FIG. 4.

The LDO regulator 416-1 and the PMIC 433 of the PM component 405 can be selectably coupled to the connector/interface 403 responsive to whether the PSV 202 received from the PPS 201 corresponds to (e.g., as determined by monitoring unit 430) a normal power mode or a low power mode. As such, when the PSV 202 is within a range of voltages corresponding to the low power mode, a first supply voltage 422 of, for example, 3.3V can be provided from the connector/interface 403 to LDO 416-1. LDO 416-1 can be configured to reduce the first supply voltage 422 of 3.3V to a second supply voltage 424 of, for example, 3.0V compatible with division by the CVD 410. For example, the second supply voltage 424 of 3.0V can be provided from the LDO regulator 416-1 to the CVD 410 and the CVD 410 can be configured (e.g., by connection of three capacitors 432) to divide the 3.0V to 1.0V as a third supply voltage 426 compatible with operation of the memory components (e.g., the particular memory components 219).

The PCC 431 can be configured, as previously described, to determine a particular number of (e.g., which of) the multiple capacitors 432 of the CVD 410 to connect to reduce the second supply voltage 424 to the third supply voltage 426 compatible with operation of the memory components in the low power mode, direct the CVD 410 to connect the particular number of the multiple capacitors 432, and direct the CVD 410 to output the third supply voltage 426. The third supply voltage 426 can, in a number of embodiments, be output via a rail 218 from the CVD 410 to a particular memory component 219 as shown and described in connection with FIG. 2.

When the PSV 202 is within a range of voltages corresponding to the normal power mode, a first supply voltage 421 can be provided to the PMIC 433, rather than the LDO regulator 416-1. The SVRs 413 and/or LVR 416-2 can, for example, be configured to reduce a first supply voltage 421 of 12.0V (e.g., corresponding to the PSV 202 in the normal power mode) to a second supply voltage 414 compatible with operation of the memory components (e.g., memory components 219). In various embodiments, the second supply voltage 414 provided by the SVRs 413 and/or LVR 416-2 of the PMIC 433 can be the same as or different from the third supply voltage 426 provided by the CVD 410. For example, supply voltages 414 and 426 can differ when the particular memory components 219 have different power requirements in the normal and low power modes and/or when different memory components receive electrical power in the normal and low power modes, among other possibilities.

For clarity, the CVD 310 and PMIC 333 of FIG. 3, along with components thereof, have been described and shown as being part of PM component 305 and the LDO regulator 416-1, CVD 410, and PMIC 433 of FIG. 4, along with components thereof, have been described and shown as being part of PM component 405. However, in various embodiments, these CVDs, PMICs, and/or LDO regulators can be implemented as separate, although selectably coupled, components of their corresponding memory subsystems. In a number of embodiments, these CVDs and/or LDO regulators can be implemented as components of their corresponding PMICs.

FIG. 5 is a flow diagram of an example method 540 to operate a CVD coupled to an LVR, as shown respectively at 110 and 116 in FIG. 1 and at corresponding indicator numbers in FIGS. 2-4, in accordance with some embodiments of the present disclosure. The method 540 can be performed by processing logic that can include hardware, software (e.g., instructions run or executed on a processing device), or a combination thereof. Such hardware can, in a number of embodiments, include one or more of a processing device, circuitry, dedicated logic, programmable logic, microcode, hardware of a device, integrated circuit, etc.

The method 540 can be performed by, in a number of embodiments, one or more components of the controller 106, the processor 107, and/or the PM component 105 shown and described in connection with FIG. 1 and/or the controller 206, the processor 209, and/or the PM component 205 shown and described in connection with FIG. 2. Although shown in a particular sequence or order, unless otherwise specified, the order of the processes in the method 540 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 542, the processing device receives an input voltage (PSV 102, 202) to a PM component 105, 205 of an SSD 104, 204. The PM component 105, 205 can, in various embodiments, include a CVD 110, 210, an LVR 116, 216, and an SVR 113, 213. At block 544, the processing device determines (e.g., by input from a monitoring unit 330, 430 of the PM component) that the input voltage corresponds to a low power mode of the SSD and that the input voltage is higher than an uppermost supply voltage at which a memory component 119, 209 of the SSD is configured to operate. At block 546, the processing device selectably couples, responsive to determination of the low power mode, the CVD 110, 210 and the LVR 116, 216. At block 548, the processing device sequentially reduces the input voltage by the CVD 110, 210 and the LVR 116, 216 to a supply voltage 117, 226 for the memory component. In a number of embodiments, the supply voltage is not higher than the uppermost supply voltage at which the memory component is configured to operate.

In a number of embodiments, as described in connection with FIG. 1 and FIG. 3, the processing device can be configured to direct receipt of the input voltage as a first supply voltage 108 to the CVD 110. The processing device, responsive to a determination of the low power mode, can be further configured to disable the SVR 113 and enable the LVR 116. The processing device can be further configured to modify (e.g., increase or decrease) the input voltage, by the CVD 110, to a second supply voltage 115 compatible with operation of the LVR 116. The second supply voltage 115 can be less than a supply voltage 112 compatible with operation of the SVR 113. The processing device can be further configured to direct the second supply voltage 115 to be provided to the LVR 116. The processing device can be further configured to direct the second supply voltage 115 to be reduced, by the LVR 116, to a third supply voltage 117 compatible with operation of the memory component 119. The processing device can be further configured to direct the third supply voltage 117 to be provided, by the PM component 105, to the memory component 119.

In a number of embodiments, as described in connection with FIG. 2 and FIG. 4, the processing device, responsive to the determination of the low power mode, can be configured to disable the SVR 213 and enable the LVR 216. The processing device can be further configured to direct receipt of the input voltage as a first supply voltage 222 to the LVR 216 and reduction of the first supply voltage 222, by the LVR 216, to a second supply voltage 224 compatible with operation of the CVD 210. The processing device can be further configured to direct the second supply voltage 224 to be provided to the CVD 210. The processing device can be further configured to direct the second supply voltage 224 to be reduced, by the CVD 210, to a third supply voltage 226 compatible with operation of the memory component 219. The processing device can be further configured to direct reduction by the LVR 216, of the second supply voltage 224 to a particular voltage that is divisible by the CVD 210 to the third supply voltage 226 compatible with operation of the memory component 219. The processing device can be further configured to direct the third supply voltage 226 to be provided, by the PM component 205, to the memory component 219.

In a number of embodiments, the processing device operates with the LVR 116, 216 being configured to produce a first input-output voltage differential that is less than a second input-output voltage differential that the SVR is configured to produce. Accordingly, a two-stage reduction of the input voltage by the LVR 116, 216 and the CVD 110, 210 can be more energy efficient than a one- or two-stage reduction of the input voltage utilizing the SVR 113, 213 based, at least in part, on a difference between the first and second input-output voltage differentials.

With regard to the first configuration shown and described in connection with FIG. 1 and FIG. 3, the closer the CVD 110 second supply voltage provided as input to the LVR 116 is to the LVR 116 output voltage (third supply voltage), the higher the energy efficiency can be of the sequence of voltage reductions utilizing the CVD 110 followed by the LVR 116 due, at least in part, to the small input-output voltage differential across the LVR 116. For example, voltage reduction by a CVD can achieve a 95% energy efficiency and, when the input-output voltage differential across the LVR is 0.2V (e.g., 1.2V−1.0V=0.2V), the LVR can operate at a 92% energy efficiency, thereby yielding a total energy efficiency of 87%. With regard to the second configuration shown and described in connection with FIG. 2 and FIG. 4, the smaller the input-output voltage differential of a second supply voltage provided from the LVR 216 as an input voltage to the CVD 210, the higher the energy efficiency can be of the sequence of voltage reductions utilizing the LVR 216 followed by the CVD 210 due, at least in part, to the small input-output voltage differential across the LVR 216. For example, the LVR can operate at a 91% energy efficiency when the input-output voltage differential across the LVR is 0.3V (e.g., 3.3V−3.0V=0.3V) and the CVD can achieve a 95% energy efficiency, thereby yielding a total energy efficiency of 86%. By comparison, an LVR (e.g., an LDO) reducing a 3.6V input to a 1.0V output for an input-output voltage differential of 2.3V can, for example, be operating at a 30% energy efficiency and an SVR can operate at an even lower energy efficiency when operating at similar, or higher, input-output voltage differentials.

Figure 6:
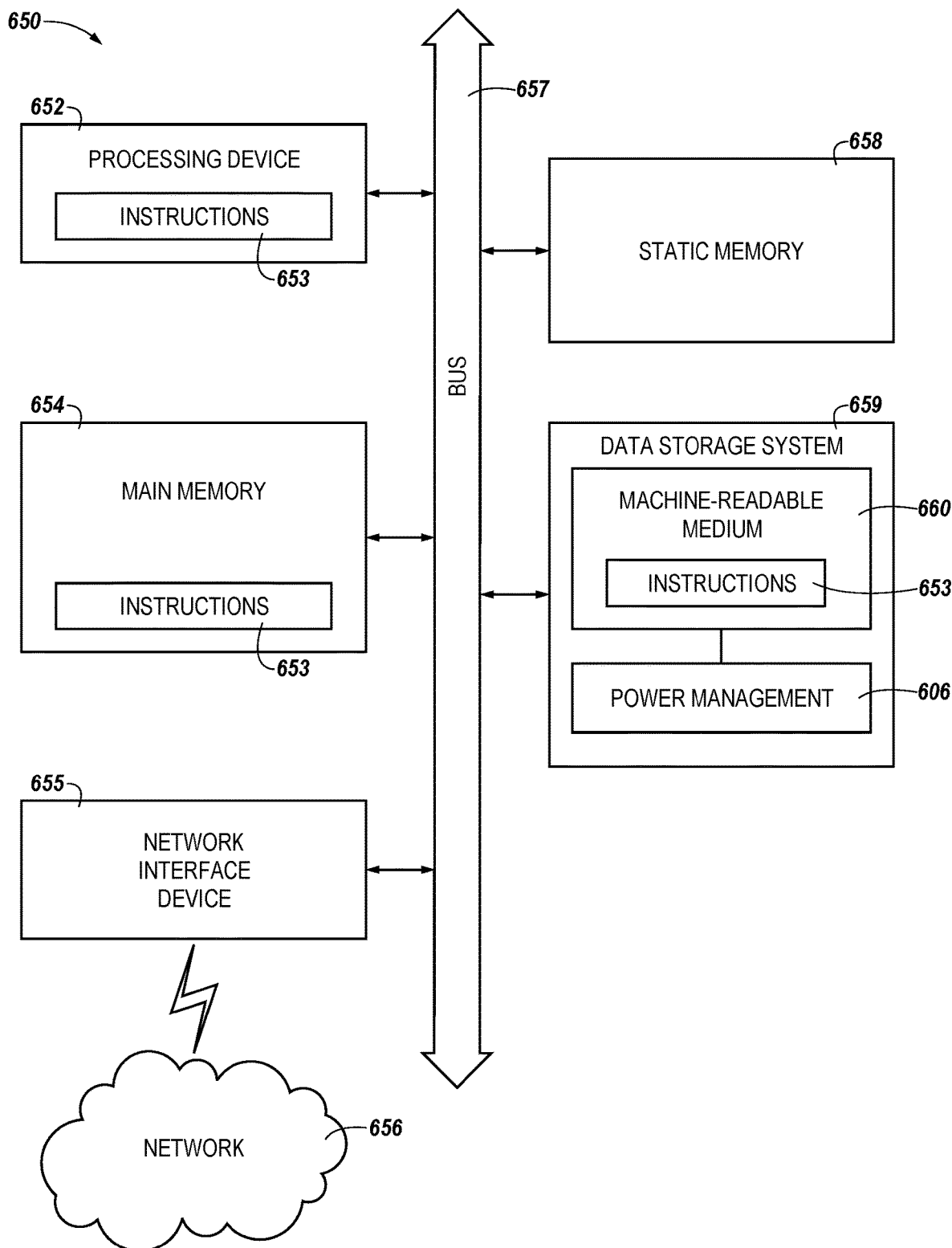
FIG. 6 is a block diagram of an example computer system in which embodiments of the present disclosure may operate.

FIG. 6 illustrates an example machine of a computer system 650 within which a set of instructions, for causing the machine to perform any one or more of the methodologies described herein, can be executed. In some embodiments, the computer system 650 can correspond to a host system (e.g., the host system described in connection with FIG. 1 and FIG. 2) that includes, is coupled to, and/or utilizes a memory sub-system such as the memory device/SSD 104 of FIG. 1 and/or the memory device/SSD 204 of FIG. 2. The computer system 650 can be used to execute operations of a controller 106/206 and/or processor 107/207 on an operating system to perform operations, including the operations performed by the PM component 105 of FIG. 1 and/or the PM component 205 of FIG. 2). In a number of embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 650 includes a processing device 652, a main memory 654, a static memory 658, and a data storage system 659, which communicate with each other via a bus 657. The main memory 654 can, in a number of embodiments, be read-only memory (ROM), flash memory, dynamic random access memory (DRAM), such as synchronous DRAM (SDRAM) or Rambus DRAM (RDRAM), among other possibilities. The static memory 658 can, in a number of embodiments, be flash memory, static random access memory (SRAM), among other possibilities. The data storage system 559 can correspond to the memory sub-system, the memory device, and the memory sub-system 104 described in connection with FIG. 1 and/or the memory sub-system 204 described in connection with FIG. 2.

Processing device 652 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 652 can also be one or more special-purpose processing devices such as an application specific integrated circuit (ASIC), a field programmable gate array (FPGA), a digital signal processor (DSP), network processor, or the like. The processing device 652 is configured to execute instructions 653 for performing the operations and steps discussed herein. The computer system 650 can further include a network interface device 655 to communicate over a network 656.

The data storage system 659 can include a machine-readable storage medium 660 (also known as a computer-readable medium) on which is stored one or more sets of instructions 653 or software embodying any one or more of the methodologies or functions described herein. The instructions 653 also can reside, completely or at least partially, within the main memory 654 and/or within the processing device 652 during execution thereof by the computer system 650. The main memory 654 and the processing device 652 also contribute to the machine-readable storage media. The machine-readable storage medium 660, data storage system 659, and/or main memory 654 can correspond to the memory sub-system 104 of FIG. 1 and/or the memory sub-system 204 of FIG. 2.

In a number of embodiments, the instructions 653 can include instructions to implement memory components corresponding to a power management component. The memory components can, for example, correspond to the functionalities of the PM component 105 of FIG. 1 and/or the PM component 205 of FIG. 2, including the respective CVDs 110, 210, the respective SVRs 113, 213, and the respective LVRs 116, 216, among others. While the machine-readable storage medium 660 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that can cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data values (bits) within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description herein. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable storage medium, such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    receiving an input voltage at a power management (PM) component of a memory sub-system, wherein the PM component comprises a capacitive voltage divider (CVD), a linear voltage regulator (LVR), and a switching voltage regulator (SVR);
    determining, by a monitoring unit of the PM component, that the input voltage corresponds to a low power mode of the memory sub-system and that the input voltage is higher than an uppermost supply voltage at which a memory component of the memory sub-system is configured to operate;
    selectably coupling, responsive to determination of the low power mode, the CVD and the LVR; and
    sequentially reducing the input voltage by the CVD and the LVR to a supply voltage for the memory component, wherein the supply voltage is not higher than the uppermost supply voltage at which the memory component is configured to operate.

2. The memory sub-system of claim 1, wherein the memory sub-system is a solid-state drive (SSD).

3. The method of claim 1, further comprising:
    receiving the input voltage as a first supply voltage to the CVD;
    responsive to the determination of the low power mode, disabling the SVR and enabling the LVR;
    modifying the first supply voltage, by the CVD, to a second supply voltage compatible with operation of the LVR, wherein the second supply voltage is less than a supply voltage compatible with operation of the SVR;
    providing the second supply voltage to the LVR;
    reducing the second supply voltage, by the LVR, to a third supply voltage compatible with operation of the memory component; and
    providing, by the PM component, the third supply voltage to the memory component.

4. The method of claim 1, further comprising:
    responsive to the determination of the low power mode, disabling the SVR and enabling the LVR;
    receiving the input voltage as a first supply voltage to the LVR;
    reducing the first supply voltage, by the LVR, to a second supply voltage compatible with operation of the CVD;
    providing the second supply voltage to the CVD;
    reducing the second supply voltage, by the CVD, to a third supply voltage compatible with operation of the memory component; and
    providing, by the PM component, the third supply voltage to the memory component.

5. The method of claim 1, further comprising reducing, by the LVR, the first supply voltage to a particular second supply voltage that is divisible by the CVD to the third supply voltage compatible with operation of a particular memory component.

6. The method of claim 1, further comprising:
    configuring the LVR to produce a first input-output voltage differential that is less than a second input-output voltage differential that the SVR is configured to produce;
    wherein a two-stage reduction of the input voltage by the LVR and the CVD is more energy efficient than a one- or two-stage reduction of the input voltage utilizing the SVR based, at least in part, on a difference between the first and second input-output voltage differentials.

7. A memory sub-system, comprising:
    a capacitive voltage divider (CVD) selectably coupled to one of a linear voltage regulator (LVR) and a switching voltage regulator (SVR); and
    a controller coupled to the CVD, the LVR, and the SVR, wherein the controller is configured, responsive to a determination that the memory sub-system receives an input voltage in a particular range as a first supply voltage, to direct that:
        the CVD reduces, by connection of a plurality of capacitors, the first supply voltage to a second supply voltage compatible with operation of the LVR; and
        the CVD is coupled to the LVR, instead of the SVR, to supply the second supply voltage.

8. The memory sub-system of claim 7, wherein the memory sub-system is a solid-state drive (SSD).

9. The memory sub-system of claim 7, further comprising a monitoring unit configured to determine whether the memory sub-system is in a low power mode or a normal power mode.

10. The memory sub-system of claim 7, wherein the controller is further configured, responsive to a determination that the memory sub-system is in a low power mode, rather than a normal power mode, to decouple the CVD from the SVR and couple the CVD to the LVR.

11. The memory sub-system of claim 7, wherein the controller is further configured, responsive to a determination that the memory sub-system is in a normal power mode, rather than a low power mode, to decouple the CVD from the LVR and couple the CVD to the SVR.

12. The memory sub-system of claim 7, wherein the LVR is configured to reduce the second supply voltage to a third supply voltage compatible with operation of a memory component of the memory sub-system.

13. The memory sub-system of claim 7, wherein the LVR is a low dropout (LDO) regulator.

14. The memory sub-system of claim 7, wherein the SVR is selected from a buck regulator and a buck/boost regulator.

15. A memory sub-system, comprising:
    a primary power supply (PPS) selectably coupled to one of a linear voltage regulator (LVR) and a switching voltage regulator (SVR); and
    a controller coupled to the LVR and the SVR, wherein the controller is configured, responsive to a determination that the memory sub-system receives an input voltage in a particular range from the PPS as a first supply voltage, to direct that:
        the LVR reduces the input voltage to a second supply voltage compatible with operation of a capacitive voltage divider (CVD); and the LVR is coupled to the CVD, instead of the SVR, to supply the second supply voltage.

16. The memory sub-system of claim 15, wherein the second supply voltage compatible with operation of the CVD is a particular voltage that is divisible by the CVD to produce a third supply voltage compatible with operation of a particular memory component of the memory sub-system.

17. The memory sub-system of claim 15, wherein the controller is further configured, responsive to a determination that the memory sub-system is in a low power mode, rather than a normal power mode, to decouple the SVR from the PPS and couple the LVR to the PPS to receive the input voltage.

18. The memory sub-system of claim 15, wherein the controller is further configured, responsive to a determination that the memory sub-system is in a normal power mode, rather than a low power mode, to decouple the LVR from the PPS and couple the SVR to the PPS to receive the input voltage.

19. The memory sub-system of claim 15, wherein:
the LVR is a low dropout (LDO) regulator configured to reduce the first supply voltage to a second supply voltage compatible with operation of the CVD; and
the CVD is configured to reduce the second supply voltage to a third supply voltage compatible with operation of a memory component of the memory sub-system.

20. The memory sub-system of claim 15, wherein the input voltage in the particular range corresponds to the memory sub-system being in either a standby mode, a slumber mode, or a sleep mode in which a lower input voltage is supplied relative to a mode that operates at a higher input voltage.

21. The memory sub-system of claim 15, wherein the higher input voltage is 12 volts (V) or higher and the lower input voltage is in a range of from 2V-5V.

* * * * *